(12) United States Patent
Tsai et al.

(10) Patent No.: US 9,190,987 B2
(45) Date of Patent: Nov. 17, 2015

(54) LATCH APPARATUS AND APPLICATIONS THEREOF

(71) Applicant: Industrial Technology Research Institute, Hsinchu (TW)

(72) Inventors: Chia-Ming Tsai, Hsinchu (TW); Bo-Jyun Kuo, Hsinchu (TW); Bo-Wei Chen, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/798,129

(22) Filed: Mar. 13, 2013

(65) Prior Publication Data

US 2014/0132323 A1    May 15, 2014

(30) Foreign Application Priority Data

Nov. 13, 2012   (TW) .............................. 101142275 A

(51) Int. Cl.
*H03K 3/356* (2006.01)
*H03K 3/012* (2006.01)

(52) U.S. Cl.
CPC .......... *H03K 3/012* (2013.01); *H03K 3/356173* (2013.01)

(58) Field of Classification Search
CPC .......................................... H03K 3/356–3/357
See application file for complete search history.

(56) References Cited

U.S. PATENT DOCUMENTS

| | | | |
|---|---|---|---|
| 4,858,195 A | 8/1989 | Soneda | |
| 5,032,744 A | 7/1991 | Wai | |
| 7,088,146 B1 | 8/2006 | Megaw | |
| 7,262,639 B2 | 8/2007 | Mulder et al. | |
| 7,872,514 B2 * | 1/2011 | Chee | 327/218 |
| 7,911,237 B2 | 3/2011 | Maone | |
| 8,031,547 B2 | 10/2011 | Fort et al. | |
| 8,045,647 B2 | 10/2011 | Oh et al. | |
| 2008/0136481 A1 * | 6/2008 | Chung et al. | 327/201 |
| 2009/0111412 A1 | 4/2009 | Sumesaglam | |
| 2009/0284288 A1 | 11/2009 | Zhang et al. | |

(Continued)

FOREIGN PATENT DOCUMENTS

| | | |
|---|---|---|
| CN | 102204097 A | 9/2011 |
| TW | 589783 | 6/2004 |

(Continued)

OTHER PUBLICATIONS

Kobayashi et al., "A Current-Controlled Latch Sense Amplifier and a Static Power-Saving input Buffer for Low-Power Architecture", IEEE Journal of Solid-State Circuits, Apr. 1993, pp. 523~527, vol. 28, No. 4.

(Continued)

*Primary Examiner* — Sibin Chen
(74) *Attorney, Agent, or Firm* — Jianq Chyun IP Office

(57) ABSTRACT

A latch apparatus and applications thereof are provided. The latch apparatus consists of a latch circuit and a switchable DC block unit. The switchable DC block unit is coupled to the latch circuit, and configured to: isolate a cross-coupling path in the latch circuit and store a voltage difference before the latch apparatus performs the latching operation; and when the latch apparatus performs the latching operation, provide the stored voltage varying with time to increase the overdrive voltage of at least one transistor in the latch circuit (increase the transistor transconductance), so that the latch apparatus maintains high speed operation at low supply voltage.

12 Claims, 4 Drawing Sheets

(56) References Cited

U.S. PATENT DOCUMENTS

| | | |
|---|---|---|
| 2010/0123484 A1 | 5/2010 | Peterson |
| 2010/0237908 A1 | 9/2010 | Chatal |
| 2012/0098690 A1 | 4/2012 | Dinc et al. |

FOREIGN PATENT DOCUMENTS

| | | |
|---|---|---|
| TW | I257107 | 6/2006 |
| TW | 201138312 | 11/2011 |
| TW | I357722 | 2/2012 |
| TW | 201209843 | 3/2012 |

OTHER PUBLICATIONS

Schinkel et al., "A Double-Tail Latch-Type Voltage Sense Amplifier with 18ps Setup+Hold Time", 2007 IEEE International Solid-State Circuits Conference, Feb. 11-15, 2007, pp. 314~315 and 605.

Goll et al., "A 0.12um CMOS Comparator Requiring 0.5V at 600Hz and 1.5V at 6GHz", 2007 IEEE International Solid-State Circuits Conference, Feb. 11-15, 2007, pp. 316~317 and 605.

Miyahara et al., "A Low-Noise Self-Calibrating Dynamic Comparator for High-Speed ADCs", IEEE Asian Solid-State Circuits Conference, Nov. 3-5, 2008, pp. 269~272.

Goll et al., "A 65nm CMOS Comparator with Modified Latch to Achieve 7GHz/1.3mW at 1.2V and 700MHz/47μW at 0.6V", 2009 IEEE International Solid-State Circuits Conference, Feb. 2009, pp. 328~329 and 1 more page.

Goll et al., "A Comparator With Reduced Delay Time in 65nm CMOS for Supply Voltage Down to 0.65 V", IEEE Transactions on Circuits and Systems-II :Express Briefs, Nov. 2009, pp. 810~814, vol. 56, No. 11.

"Office Action of Taiwan Counterpart Application," issued on Jan. 6, 2015, p. 1-p. 4, in which the listed references were cited.

\* cited by examiner

US 9,190,987 B2

LATCH APPARATUS AND APPLICATIONS THEREOF

CROSS-REFERENCE TO RELATED APPLICATION

This application claims the priority benefit of Taiwan application serial no. 101142275, filed on Nov. 13, 2012. The entirety of the above-mentioned patent application is hereby incorporated by reference herein and made a part of this specification.

BACKGROUND

1. Technical Field

The technical field relates to a latch apparatus and applications thereof.

2. Related Art

Low supply voltage circuit design is emphasized in research nowadays. Large volumes of research papers and patents have explored circuit design techniques in analog or digital circuits with the constraint of low supply voltage. Besides advanced process manufacturing techniques suitable for low supply voltage, a typical method to achieve low power consumption is to directly reduce the supply voltage of a circuit. However, by lowering the supply voltage of the circuit, many operational conditions of the circuit are limited, and the operating speed of the circuit is directly affected. Therefore, one of the most important research topics is how to solve the problem of speed attenuation at low supply voltage.

SUMMARY

An exemplary embodiment of the disclosure provides a latch apparatus including a latch circuit and a switchable direct current (DC) block unit. The switchable DC block unit is coupled to the latch circuit, and the switchable DC block unit configured to: isolate a cross-coupling path in the latch circuit and store a voltage difference before the latch apparatus performs a latch operation; and when the latch apparatus performs the latching operation, provide the stored voltage difference varying with time to increase the transconductance of at least one transistor in the latch circuit.

Another embodiment of the disclosure provides a comparator based on the provided latch apparatus.

Several exemplary embodiments accompanied with figures are described in detail below to further describe the disclosure in details.

BRIEF DESCRIPTION OF DRAWINGS

The accompanying drawings constituting a part of this specification are incorporated herein to provide a further understanding of the disclosure. Here, the drawings illustrate embodiments of the disclosure and, together with the description, serve to explain the principles of the disclosure.

DETAILED DESCRIPTION OF DISCLOSED EMBODIMENTS

Figure 1:
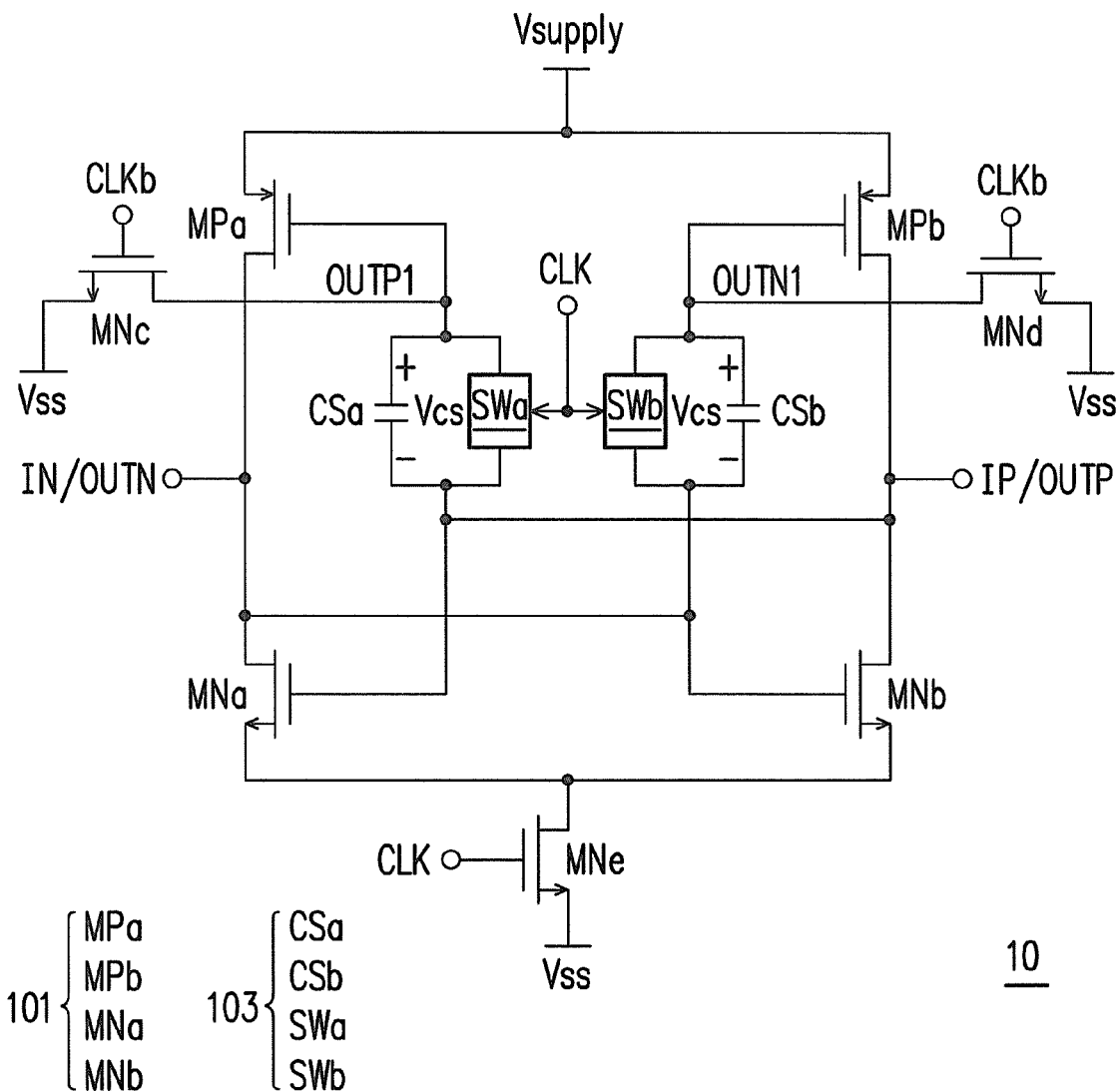
FIG. 1 is a schematic view of a first latch apparatus 10 according to an exemplary embodiment of the disclosure.

Descriptions of the disclosure are given with reference to the exemplary embodiments illustrated with accompanied drawings. Moreover, elements/components/notations with same reference numerals represent same or similar parts in the drawings and embodiments.

FIG. 1 is a schematic view of a first latch apparatus 10 according to an exemplary embodiment of the disclosure. With reference to FIG. 1, the first latch apparatus 10 includes a latch circuit 101, a switchable direct current (DC) block unit 103, and the N-type transistors MNc, MNd, and MNe. The latch circuit 101 includes the P-type transistors MPa and MPb and the N-type transistors MNa and MNb. Moreover, the switchable DC block unit 103 includes the capacitors CSa and CSb and the switch units SWa and SWb.

The P-type transistors MPa and MPb have sources coupled to a supply voltage Vsupply of the latch apparatus 10. The P-type transistor MPa has a drain coupled to a drain of the N-type transistor MNa. The P-type transistor MPb has a drain coupled to a drain of the N-type transistor MNb. The N-type transistors MNa and MNb have sources coupled together, and the sources of the N-type transistors MNa and MNb are coupled to a reference potential Vss (e.g. the ground potential, although not limited thereto) through the N-type transistor MNe.

The capacitor CSa is coupled between a gate of the P-type transistor MPa and a gate of the N-type transistor MNa. The capacitor CSb is coupled between a gate of the P-type transistor MPb and a gate of the N-type transistor MNb. The switch unit SWa and the capacitor CSa are connected in parallel, and the switch unit SWa is controlled by a clock signal CLK. The switch unit SWb and the capacitor CSb are connected in parallel, and the switch unit SWa is controlled by a clock signal CLK.

Figure 2:
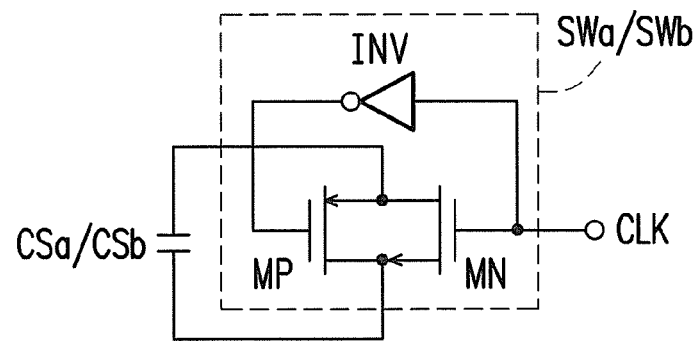
FIG. 2 is a schematic view of the switch units SWa and SWb depicted in FIG. 1.

In detail, FIG. 2 is a schematic view of the switch unit SWa/SWb depicted in FIG. 1. With reference to FIGS. 1 and 2, each switch unit SWa/SWb is formed by an N-type transistor MN, a P-type transistor MP, and an inverter INV.

The N-type transistor MN has a gate to receive the clock signal CLK. The P-type transistor MP has a source coupled to a drain of the N-type transistor MN and a first terminal of the capacitor CSa/CSb. A drain of the P-type transistor MP is coupled to a source of the N-type transistor MN and a second terminal of the capacitor CSa/CSb. The inverter INV has an input terminal coupled to the gate of the N-type transistor MN. An output terminal of the inverter INV is coupled to a gate of the P-type transistor MP.

The N-type transistor MNa has a gate coupled to the drains of the P-type transistor MPb and the N-type transistor MNb. The N-type transistor MNb has a gate coupled to the drains of the P-type transistor MPa and the N-type transistor MNa.

The N-type transistor MNc has a gate receiving an inverse clock signal CLKb of the clock signal CLK (the phase difference between CLK and CLKb is 180 degrees), a source coupled to the reference potential Vss, and a drain coupled to the gate of the P-type transistor MPa.

The N-type transistor MNd has a gate receiving the inverse clock signal CLKb, a source coupled to the reference potential Vss, and a drain coupled to the gate of the P-type transistor MPb.

The N-type transistor MNe has a gate receiving the clock signal CLK, a drain coupled to the sources of the N-type transistors MNa and MNb, and a source coupled to the reference potential Vss.

In the present embodiment, the switchable DC block unit 103 is coupled to the latch circuit 101. Moreover, the switchable DC block unit 103 is configured to isolate a cross-coupling path in the latch circuit 101 and store a voltage difference (Vcs) relative to the supply voltage Vsupply of the latch apparatus 10 before the latch circuit 101 performs a latch operation. Moreover, when the latch circuit 101 performs the latching operation, the switchable DC block unit 103 is configured to provide the stored voltage difference (Vcs) varying with time to increase an overdrive voltage (e.g. Vov, that is, Vgs-Vth) of transistors (e.g. P-type transistors MPa and MPb and the N-type transistors MNa and MNb) in the latch circuit 101, and thereby not only enhancing the transconductance of the transistors, but also achieve high speed operation under the constraint of low supply voltage (Vsupply).

In detail, assume the clock signal CLK is at a low logic level ("0") before the latch circuit 101 performs the latch operation. Under this condition, the switch units (SWa and SWb) are turned off. Moreover, the N-type transistors MNc and MNd are turned on in response to the inverse clock signal CLKb being at a high logic level ("1"), such that the output terminals OUTN1 and OUTP1 are both discharged to the reference potential Vss. At the same time, the P-type transistors MPa and MPb also turn on in response to the N-type transistors MNc and MNd being turned on. Accordingly, the output terminals (OUTN and OUTP) of the latch apparatus 10 are charged to the supply voltage Vsupply, so that the capacitors (CSa and CSb) store a voltage difference (Vcs=OUTP1−OUTP=OUTN1−OUTN=Vss−Vsupply) before the latch circuit 101 performs the latch operation.

On the other hand, assume the clock signal CLK is at the high logic level ("1") before the latch circuit 101 performs the latch operation. The latch circuit 101 performs a signal regeneration operation based on a signal difference of the input terminals (IN and IP). It should be noted that, the input terminals (IN and IP) and the output terminals (OUTN and OUTP) of the first latch apparatus 10 are the same. When the latch circuit 101 is about to perform the latch operation, since a source-gate voltage ($V_{SG}$) of the P-type transistors MPa and MPb and a gate-source voltage ($V_{GS}$) of the N-type transistors MNa and MNb are very close to the supply voltage Vsupply, the transistors (MPa, MPb, MNa, and MNb) obtain a greater overdrive voltage, and thereby the transconductance (gm) of the P-type transistors MPa and MPb and the N-type transistors MNa and MNb is increased. At the same time, the switch units (SWa and SWb) and the N-type transistor MNe are turned on, and the N-type transistors MNc and MNd are turned off in response to the inverse clock signal CLKb being at the low logic level ("0").

When the latch circuit 101 performs the latch operation, first the output terminals (OUTN and OUTP) are respectively stabilized near a common-mode level through two respective DC paths formed by the transistors MPa, MNa, and MNe, and the transistors MPb, MNb, and MNe. The output terminals (OUTN and OUTP) are then respectively stabilized to the supply voltage Vsupply or the reference potential Vss according to the input signals (e.g., the signals inputted in the input terminals IN and IP).

For example, if the input signal of the input terminal (IP) is greater than the other input terminal (IN), the output terminal (OUTP) is stabilized toward the supply voltage Vsupply, and the other output terminal (OUTN) is stabilized toward the reference potential Vss. It should be noted that, during the process of stabilizing the output terminal (OUTN) toward the reference potential Vss, if the charge stored in a terminal (OUTN1) of the capacitor (CSb) cannot be immediately discharged by the switch unit (SWb), that caused the potential of the output terminal (OUTN1) is lower than the reference potential Vss. Therefore, the source-gate voltage ($V_{SG}$) of the transistor (MPb) is higher than the supply voltage Vsupply. Accordingly, the overdrive voltage of the transistor (MPb) is increased, and thereby a boosting effect is achieved for the transconductance (gin) of the transistor (MPb), such that the speed of the output terminals (OUTN and OUTP) respectively stabilizing toward the reference potential Vss and the supply voltage Vsupply is accelerated.

The switch unit (SWb) in the turn on state then coordinates with the N-type transistors (MNa and MNe) to discharge the capacitor (CSb). The switch unit (SWa) coordinates with the P-type transistor (MPb) to charge the capacitor (CSa). After signal regeneration is completed, the output terminals (OUTN and OUTP) are respectively stabilized to the reference potential Vss and the supply voltage Vsupply.

Based on the foregoing description, since the capacitors (CSa and CSb) store the voltage difference (Vcs) relative to the supply voltage Vsupply of the latch apparatus 10 before the latch circuit 101 performs the latch operation, therefore, when not considering the drain-source voltage ($V_{Ds}$) of the N-type transistor MNe, a lowest supply voltage (Vsupply_min) of the latch apparatus 10 may be approximately close to $2|V_{GS}|-|Vcs|$ (i.e. Vsupply_min≈$2|V_{GS}|-|Vcs|$). Compared to conventional latch circuits using the two cross-coupled inverters structure, where the lowest supply voltage (Vsupply_min) is required to be $2|V_{GS}|$ (i.e. Vsupply_min=$2|V_{GS}|$), the latch apparatus 10 can achieve lower voltage operation.

Due to the switchable DC block unit 103, it should be appreciated that the overdrive voltages of the critical transistors (MPa, MPb, MNa, and MNb) in the latch circuit 101 can be increased at low supply voltage (Vsupply), and thereby the transconductance (gm) of the transistors (MPa, MPb, MNa, and MNb) can be enhanced. Therefore, the latch apparatus 10 can maintain high speed operation at low supply voltage.

Figure 3:
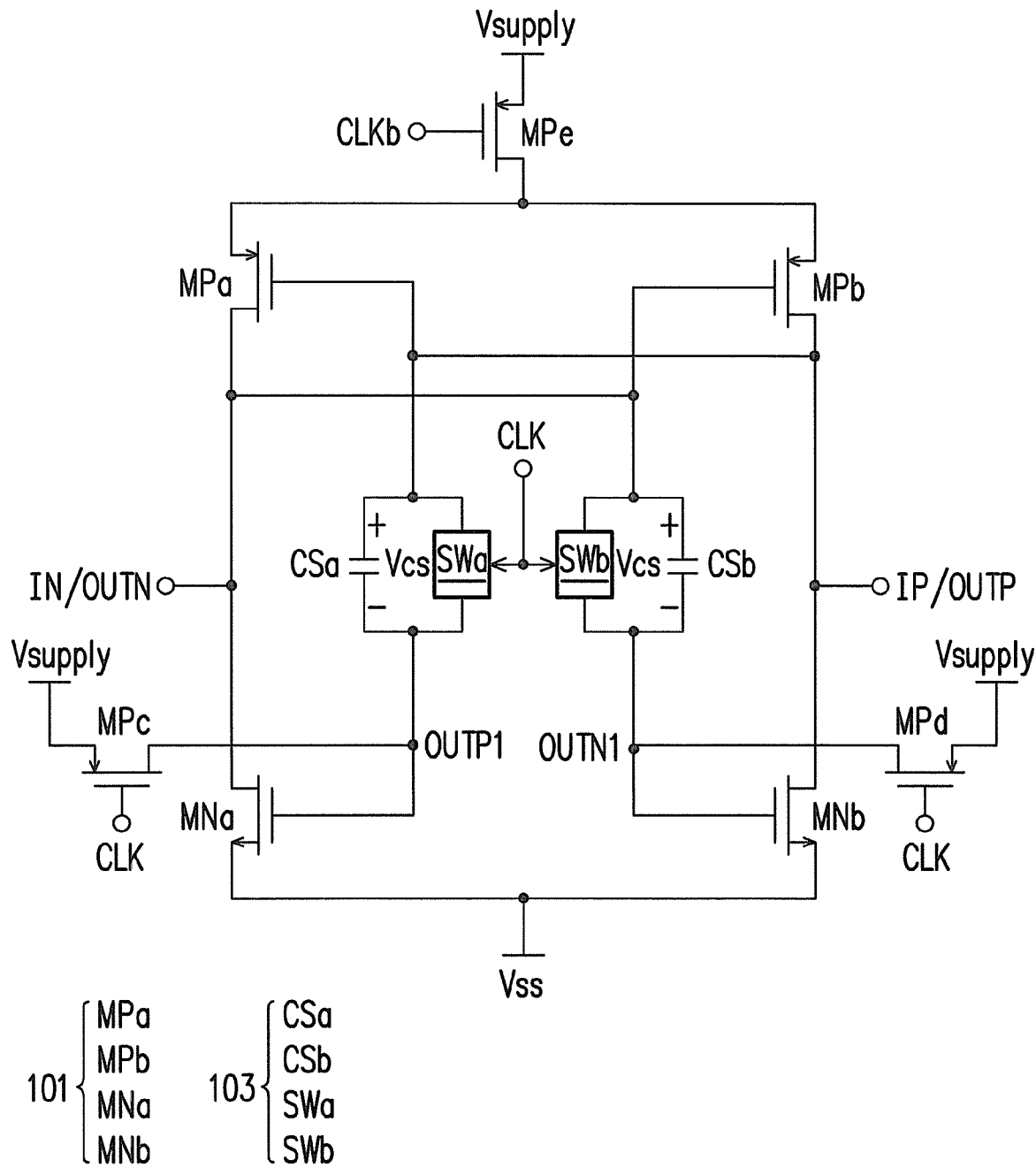
FIG. 3 is a schematic view of a second latch apparatus 10' according to an exemplary embodiment of the disclosure.

In another aspect, FIG. 3 is a schematic view of a second latch apparatus 10' according to an exemplary embodiment of the disclosure. With reference to FIG. 3, the second latch apparatus 10' and the first latch apparatus 10 are complementary circuit structures. The second latch apparatus 10' includes the latch circuit 101, the switchable DC block unit 103, and a plurality of P-type transistors MPc, MPd, and MPe. The latch circuit 101 also includes the P-type transistors MPa and MPb and the N-type transistors MNa and MNb. Moreover, the switchable DC block unit 103 also includes the capacitors CSa and CSb and the switch units SWa and SWb.

The P-type transistors MPa and MPb have sources coupled together and to the supply voltage Vsupply of the latch apparatus 10 through the P-type transistor MPe. The P-type transistor MPa has a drain coupled to a drain of the N-type transistor MNa. The P-type transistor MPb has a drain coupled to a drain of the N-type transistor MNb. The N-type transistors MNa and MNb have sources coupled to the reference potential Vss (e.g. the ground potential, although not limited thereto).

Similarly, the capacitor CSa is coupled between a gate of the P-type transistor MPa and a gate of the N-type transistor MNa. The capacitor CSb is coupled between a gate of the P-type transistor MPb and a gate of the N-type transistor MNb. The switch unit SWa and the capacitor CSa are connected in parallel, and the switch unit SWa is controlled by the clock signal CLK. The switch unit SWb and the capacitor CSb are connected in parallel, and the switch unit SWb is controlled by the clock signal CLK. The implementation of the switch unit SWa/SWb is as depicted in FIG. 2, and therefore further elaboration thereof is omitted hereafter.

The P-type transistor MPa has a gate coupled to the drains of the P-type transistor MPb and the N-type transistor MNb. The P-type transistor MPb has a gate coupled to the drains of the P-type transistor MPa and the N-type transistor MNa.

The P-type transistor MPc has a gate receiving the clock signal CLK, a source coupled to the supply voltage Vsupply of the latch apparatus 10', and a drain coupled to the gate of the N-type transistor MNa.

The P-type transistor MPd has a gate receiving the clock signal CLK, a source coupled to the supply voltage Vsupply of the latch apparatus 10', and a drain coupled to the gate of the N-type transistor MNb.

The P-type transistor MPe has a gate receiving the inverse clock signal CLKb of the clock signal CLK (the phase difference between CLK and CLKb is 180 degrees), a drain coupled to the sources of the P-type transistors MPa and MPb, and a source coupled to the supply voltage Vsupply of the latch apparatus 10'.

In the present embodiment, assume the clock signal CLK is at the low logic level ("0") before the latch circuit 101 performs the latch operation, so that the inverse clock signal CLKb is at the high logic level ("1"). Under this condition, the switch units (SWa and SWb) and the P-type transistor MPe are turned off, and the P-type transistors MPc and MPd are turned on in response to the clock signal CLK being at the low logic level ("0"). At the same time, the N-type transistors MNa and MPb are also turn on in response to the P-type transistors MPc and MPd being turned on. Accordingly, the output terminals (OUTN and OUTP) of the latch apparatus 10' are discharged to the reference potential Vss of the latch apparatus 10', so that the capacitors (CSa and CSb) store a voltage difference (Vcs=Vss−Vsupply) before the latch circuit 101 performs the latch operation.

On the other hand, assume the clock signal CLK is at the high logic level ("1") before the latch circuit 101 performs the latch operation (i.e. the signal regeneration), so that the inverse clock signal CLKb is at the low logic level ("0"). Under this condition, since the source-gate voltage ($V_{SG}$) of the P-type transistors MPa and MPb and the gate-source voltage ($V_{GS}$) of the N-type transistors MNa and MNb are very close to the supply voltage Vsupply, the transistors (MPa, MPb, MNa, and MNb) obtain a greater overdrive voltage, and thereby the transconductance (gm) of the P-type transistors MPa and MPb and the N-type transistors MNa and MNb is increased. At the same time, the switch units (SWa and SWb) and the P-type transistor MPe are turned on, and the P-type transistors MPc and MPd are turned off in response to the clock signal CLK being at the high logic level ("1").

When the latch circuit 101 performs the latch operation, first the output terminals (OUTN and OUTP) are respectively stabilized near a common-mode level through two respective DC paths formed by the transistors MPa, MNa, and MPe, and the transistors MPb, MNb, and MPe. The output terminals (OUTN and OUTP) are then respectively stabilized to the supply voltage Vsupply or the reference potential Vss according to the input signals (e.g., the signals inputted in the input terminals IN and IP).

For example, if the input signal of the input terminal (IP) is greater than the other input terminal (IN), the output terminal (OUTP) is stabilized toward the supply voltage Vsupply, and the other output terminal (OUTN) is stabilized toward the reference potential Vss. It should be noted that, during the process of stabilizing the output terminal (OUTP) toward the supply voltage Vsupply, if the charge stored in a terminal (OUTP1) of the capacitor (CSa) cannot be immediately charged by the switch unit (SWa), the potential of the output terminal (OUTP1) is higher than the supply voltage Vsupply. Therefore, the gate-source voltage ($V_{GS}$) of the transistor (MPa) is higher than the supply voltage Vsupply. Accordingly, the overdrive voltage of the transistor (MPa) is increased, and thereby the boosting effect is achieved for the transconductance (gm) of the transistor (MPa), such that the speed of the output terminals (OUTN and OUTP) respectively stabilizing toward the reference potential Vss and the supply voltage Vsupply is accelerated.

The switch unit (SWa) in the turn on state then coordinates with the P-type transistors (MPb and MPe) to charge the capacitor (CSa). The switch unit (SWb) coordinates with the N-type transistor (MNa) to discharge the capacitor (CSb). After signal regeneration is completed, the output terminals (OUTN and OUTP) are respectively stabilized to the reference potential Vss and the supply voltage Vsupply.

Clearly, the second latch apparatus 10' depicted in FIG. 3 can achieve similar technical effects as the first latch apparatus 10 shown in FIG. 1. That is to say, the second latch apparatus 10' can maintain high speed operation at low supply voltage.

Figure 4:
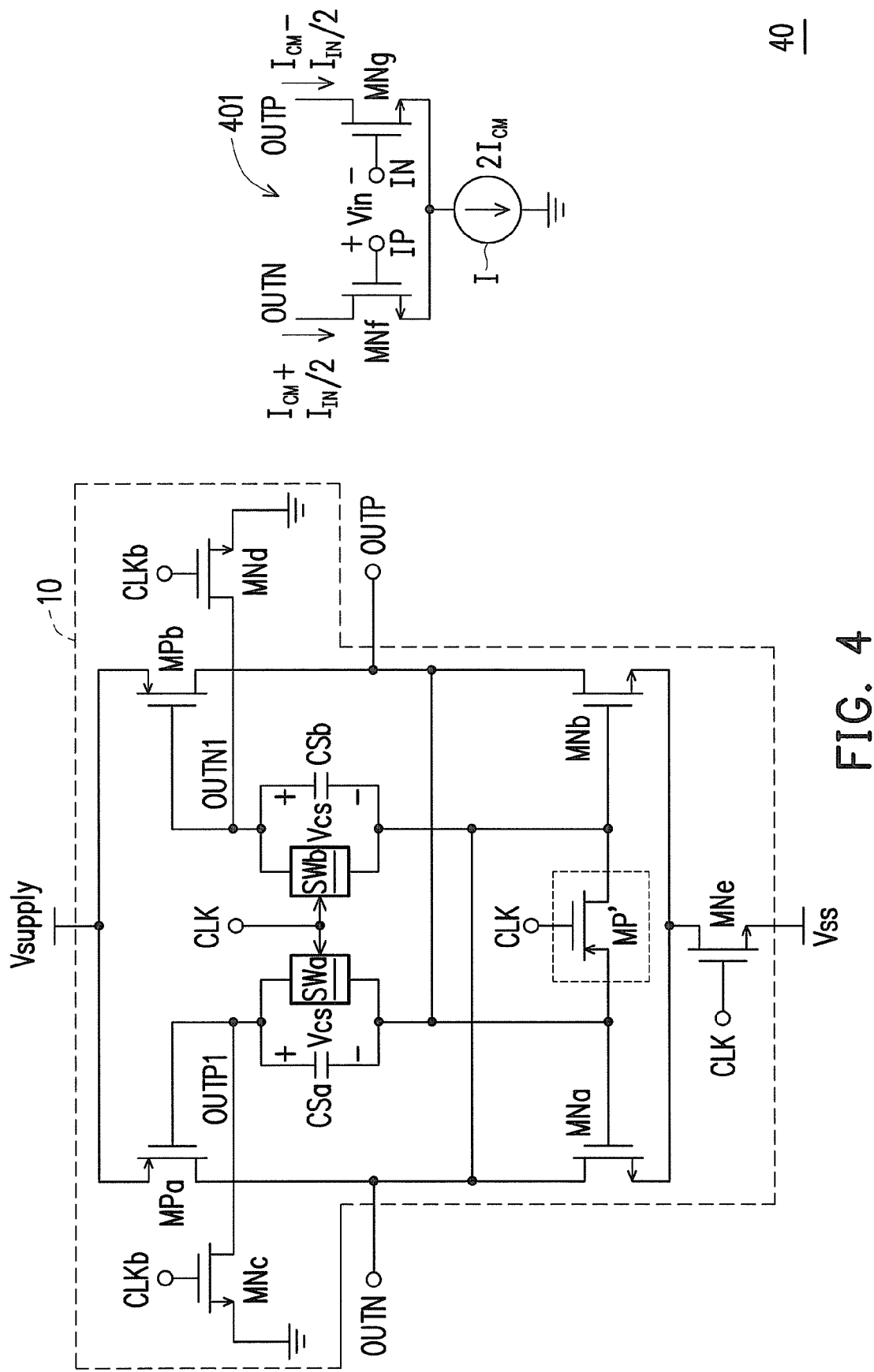
FIG. 4 is a schematic view of an application of a first latch apparatus according to an exemplary embodiment of the disclosure.

If the first latch apparatus 10 is used as an illustrative application example, the first latch apparatus 10 may be applied in a static comparator, as shown in a static comparator 40 in FIG. 4 having an equalizer function. With reference to FIG. 4, the static comparator 40 has the equalizer function due to a P-type transistor MP'. Moreover, the N-type transistors MNf and MNg and the current source I can be viewed as an input stage 401 of the static comparator 40.

When the static comparator 40 is operated in a reset mode, the capacitors (CSa and CSb) in the first latch apparatus 10 store a voltage difference (Vcs=OUTP1−OUTP=OUTN1−OUTN). When the static comparator 40 is operated in a comparison mode, two generated current data ($I_{CM}+I_{IN}/2$, $I_{CM}-I_{IN}/2$) are provided to the first latch apparatus 10 in response to the input signals Vin (+,−) received by the gates (i.e. the input terminals (IP and IN) of the static comparator 40) of the N-type transistors MNf and MNg. Moreover, due to the voltage difference (Vcs) stored earlier by the capacitors (CSa and CSb), the transconductance (gm) of the P-type transistors MPa and MPb and the N-type transistors MNa and MNb is increased, so that the first latch apparatus 10 can rapidly perform signal regeneration after receiving the input signals and thereby finish the transition from the input signals in the analog domain to comparison results in the digital domain.

Figure 5:
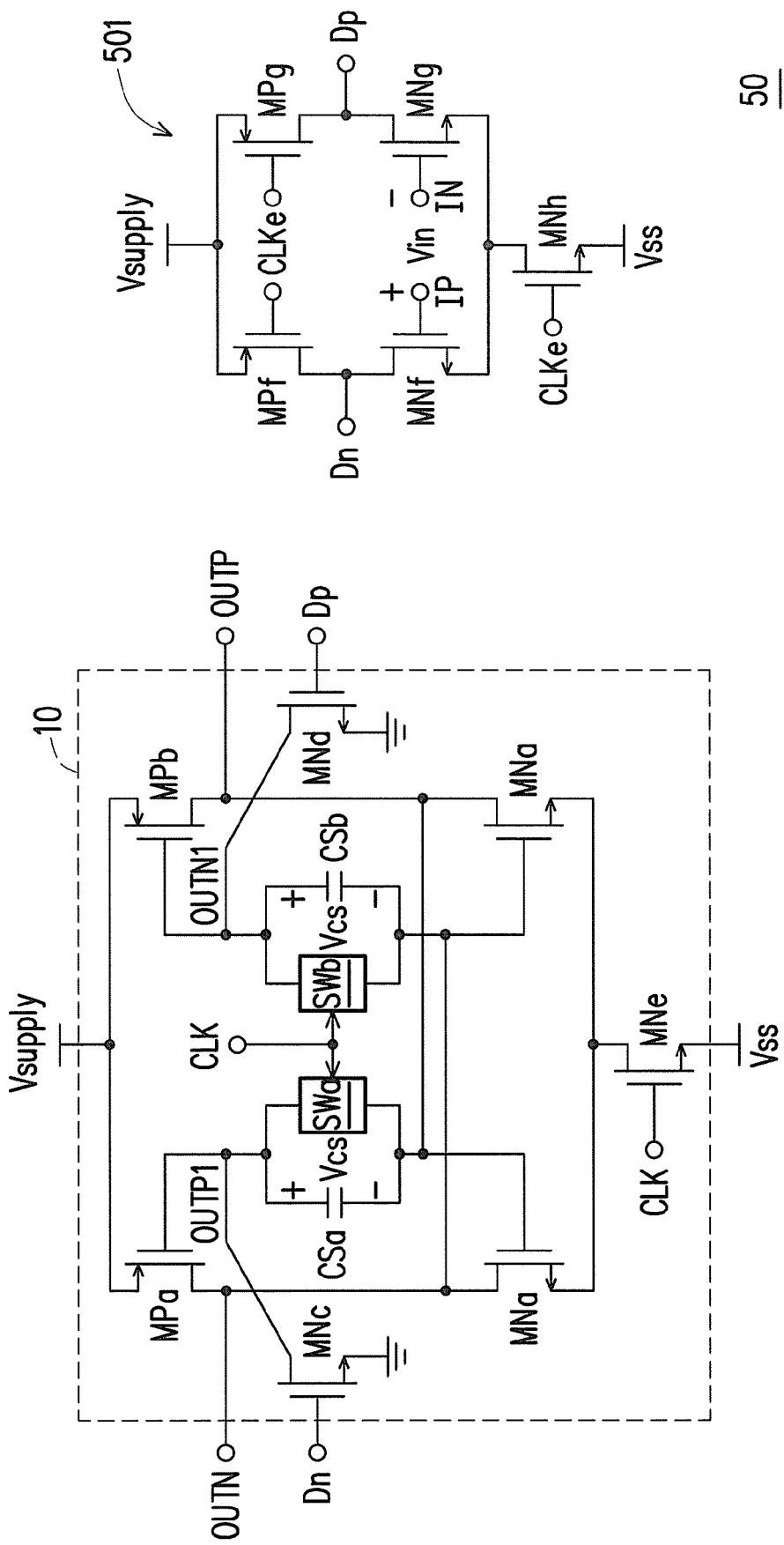
FIG. 5 is a schematic view of an application of a first latch apparatus according to another exemplary embodiment of the disclosure.

On the other hand, the first latch apparatus 10 may be applied in a dynamic comparator, as shown in a dynamic comparator 50 depicted in FIG. 5 having a dynamic preamplifier. With reference to FIG. 5, the P-type transistors MPf and MPg and the N-type transistors MNf, MNg, and MNh may be viewed as an input stage 501 of the dynamic comparator 50. The P-type transistors MPf and MPg and the N-type transistor MNh are controlled by a clock signal CLKe (which can exceed the clock signal CLK by a phase difference), and the input signals Vin (+,−) can be inputted in the gates (i.e. the input terminals (IP and IN) of the dynamic comparator 50) of the N-type transistors MNf and MNg, respectively. It should be noted that, the gates of the N-type transistors MNc and MNd in the first latch apparatus 10 are respectively altered to couple to the terminals Dn and Dp of the input stage 501.

Similarly, when the dynamic comparator 50 is operated in the reset mode, the capacitors (CSa and CSb) in the first latch apparatus 10 store a voltage difference (Vcs=OUTP1−

OUTP=OUTN1−OUTN). When the dynamic comparator 50 is operated in the comparison mode, Dp and Dn are provided to the first latch apparatus 10 in response to the input signals Vin (+,−) received by the gates (i.e. the input terminals (IP and IN) of the dynamic comparator 50) of the N-type transistors MNf and MNg. Moreover, due to the voltage difference (Vcs) stored earlier by the capacitors (CSa and CSb), the transconductance (gm) of the P-type transistors MPa and MPb and the N-type transistors MNa and MNb is increased, so that the first latch apparatus 10 can rapidly perform signal regeneration after receiving the signals transmitted from the terminals Dp and Dn, and thereby finish the transition from the input signals in the analog domain to comparison results in the digital domain.

It should be appreciated that, besides being applied in the static/dynamic comparator 40/50, the first latch apparatus 10 may also be applied in circuits requiring the latch function, such as in the sense amplifiers and flip-flops used in memories (e.g. SRAM and DRAM). Therefore, the application scope of the first latch apparatus 10 is not limited by the embodiments shown in FIGS. 4 and 5.

In addition, although the foregoing embodiments used the first latch apparatus 10 as an illustrative example to facilitate description, by analogy people skilled in the art can derive the application implementation of the second latch apparatus 10', and therefore further elaboration thereof is omitted hereafter.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A latch apparatus, comprising:
    a latch circuit comprising a first inverter circuit and a second inverter circuit, wherein the first inverter circuit and the second inverter circuit are cross-coupled with each other; and
    a switchable direct current (DC) block unit coupled to the latch circuit and disposed on a cross-coupling path of the cross-coupled first and second inverter circuits, wherein the switchable DC block unit is configured to:
        isolate the cross-coupling path of the cross-coupled first and second inverter circuits and store a voltage difference opposite to a supply voltage of the latch apparatus before the latch circuit performs a latch operation; and
        when the latch circuit performs the latch operation, provide the stored voltage difference varying with time to increase the transconductance of at least one transistor in the cross-coupled first and second inverter circuits of the latch circuit.

2. The latch apparatus of claim 1, wherein the cross-coupled first and second inverter circuits of the latch circuit comprises:
    a first P-type transistor;
    a second P-type transistor;
    a first N-type transistor; and
    a second N-type transistor,
    wherein, the first and second P-type transistors have sources coupled to the supply voltage of the latch apparatus, drains of the first P-type transistor and the first N-type transistor are coupled together, drains of the second P-type transistor and the second N-type transistor are coupled together, and the first and second N-type transistors have sources coupled to a reference potential.

3. The latch apparatus of claim 2, wherein the switchable DC block unit comprises:
    a first capacitor coupled between a gate of the first P-type transistor and a gate of the first N-type transistor;
    a second capacitor coupled between a gate of the second P-type transistor and a gate of the second N-type transistor;
    a first switch unit connected in parallel with the first capacitor, wherein the first switch unit is controlled by a clock signal; and
    a second switch unit connected in parallel with the second capacitor, wherein the second switch unit is controlled by the clock signal.

4. The latch apparatus of claim 3, wherein the first switch unit comprises:
    a third N-type transistor having a gate receiving the clock signal;
    a third P-type transistor having a source coupled to a drain of the third N-type transistor and a first terminal of the first capacitor, and a drain coupled to a source of the third N-type transistor and a second terminal of the first capacitor; and
    an inverter having an input terminal coupled to a gate of the third N-type transistor, and an output terminal coupled to a gate of the third P-type transistor.

5. The latch apparatus of claim 3, wherein the second switch unit comprises:
    a third N-type transistor having a gate receiving the clock signal;
    a third P-type transistor having a source coupled to a drain of the third N-type transistor and a first terminal of the second capacitor, and a drain coupled to a source of the third N-type transistor and a second terminal of the second capacitor; and
    an inverter having an input terminal coupled to a gate of the third N-type transistor, and an output terminal coupled to a gate of the third P-type transistor.

6. The latch apparatus of claim 3, wherein:
    the gate of the first N-type transistor is coupled to the drains of the second P-type transistor and the second N-type transistor; and
    the gate of the second N-type transistor is coupled to the drains of the first P-type transistor and the first N-type transistor.

7. The latch apparatus of claim 6, further comprising:
    a third N-type transistor having a gate receiving an inverse clock signal of the clock signal, a source coupled to the reference potential, and a drain coupled to the gate of the first P-type transistor; and
    a fourth N-type transistor having a gate receiving the inverse clock signal, a source coupled to the reference potential, and a drain coupled to the gate of the second P-type transistor.

8. The latch apparatus of claim 7, further comprising:
    a fifth N-type transistor having a gate receiving the clock signal, a drain coupled to the sources of the first and second N-type transistors, and a source coupled to the reference potential.

9. The latch apparatus of claim 3, wherein:
    the gate of the first P-type transistor is coupled to the drains of the second P-type transistor and the second N-type transistor; and
    the gate of the second P-type transistor is coupled to the drains of the first P-type transistor and the first N-type transistor.

10. The latch apparatus of claim 9, further comprising:
a third P-type transistor having a gate receiving the clock signal, a source coupled to the supply voltage of the latch apparatus, and a drain coupled to the gate of the first N-type transistor; and
a fourth P-type transistor having a gate receiving the clock signal, a source coupled to the supply voltage of the latch apparatus, and a drain coupled to the gate of the second N-type transistor.

11. The latch apparatus of claim 10, further comprising:
a fifth P-type transistor having a gate receiving an inverse clock signal of the clock signal, a drain coupled to the sources of the first and second P-type transistors, and a source coupled to the supply voltage of the latch apparatus.

12. A comparator having the latch apparatus of claim 1.

* * * * *